(12) United States Patent
Lee

(10) Patent No.: US 6,621,749 B2
(45) Date of Patent: Sep. 16, 2003

(54) INTEGRATED CIRCUIT MEMORY DEVICES PROVIDING PER-BIT REDUNDANCY AND METHODS OF OPERATING SAME

(75) Inventor: Jae-Goo Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/068,143

(22) Filed: Feb. 6, 2002

(65) Prior Publication Data
US 2002/0109154 A1 Aug. 15, 2002

(30) Foreign Application Priority Data
Feb. 14, 2001 (KR) .......................................... 2001-7277

(51) Int. Cl.$^7$ .............................. G11C 7/00; G11C 8/00
(52) U.S. Cl. ................. 365/200; 365/230.03; 365/225.7
(58) Field of Search ............................ 365/200, 230.01, 365/230.06, 230.03, 189.04, 225.7

(56) References Cited

U.S. PATENT DOCUMENTS

| | | | | |
|---|---|---|---|---|
| 5,455,798 A | * | 10/1995 | McClure | 365/200 |
| 5,761,138 A | * | 6/1998 | Lee et al. | 365/200 |
| 6,144,593 A | * | 11/2000 | Cowles et al. | 365/200 |
| 6,483,773 B1 | * | 11/2002 | Fister | 365/236 |

FOREIGN PATENT DOCUMENTS

| | | |
|---|---|---|
| JP | 11185493 | 7/1999 |
| KR | 1997-0029886 | 6/1997 |

OTHER PUBLICATIONS

Notice to Submit Response, Korean Application No. 10–2001–0007277, Sep. 26, 2002.

* cited by examiner

*Primary Examiner*—Thong Quoc Le
(74) *Attorney, Agent, or Firm*—Myers Bigel Sibley & Sajovec

(57) ABSTRACT

An integrated circuit memory device includes a plurality of memory cells arranged as a plurality of blocks, each of the blocks including a plurality of primary memory cells that are coupled and decoupled to and from respective input/output lines responsive to a primary column select line and a plurality of redundant memory cells that are coupled and decoupled to and from respective ones of the input/output lines responsive to a redundant column select line. A column select circuit is coupled to the primary column select lines and to the redundant column select lines. The column select circuit drives a first primary column select line associated with a primary memory cell in a first block responsive to application of a first column address. The column select circuit simultaneously drives the first primary column select line and a first redundant column select line associated with a first redundant memory cell in a second block responsive to application of a second column address. The memory device further includes a plurality of sense amplifiers, and an input/output control circuit that is configurable to selectively connect the input/output lines to the sense amplifiers such that the first primary memory cell is coupled to a sense amplifier responsive to application of the first column address and such that the first redundant memory cell is coupled to the sense amplifier responsive to application of the second column address. Related operating methods are also described

21 Claims, 6 Drawing Sheets

US 6,621,749 B2

INTEGRATED CIRCUIT MEMORY DEVICES PROVIDING PER-BIT REDUNDANCY AND METHODS OF OPERATING SAME

RELATED APPLICATION

This application claims the benefit of Korean Application No. 2001-7276, filed Feb. 14, 2001, the disclosure of which is hereby incorporated herein by reference.

BACKGROUND OF THE INVENTION

The present invention relates to integrated circuit memory devices, and more particularly, to integrated circuit memory devices with redundant cells and methods of operation thereof.

Integrated circuit memory devices commonly include spare memory cells, i.e., redundant memory cells, which are used to replace primary ("normal") memory cells that are defective. In some conventional memory devices, if at least one primary memory cell connected to a column select line CSL is defective, a column redundancy scheme is used, wherein the column select line CSL is replaced with a spare column select line SCSL. In other words, all memory cells connected to the column select line CSL are replaced with spare memory cells connected to the spare column select line SCSL, even if only one memory cell connected to the column select line is defective.

FIG. 1 shows a conventional one-to-one dedicated column redundancy scheme. Referring to FIG. 1, input/output blocks 11 and 13 each include a plurality of memory cells, column select lines CSL11, CSL12, CSL21, CSL22 connected to the plurality of memory cells, and spare column select lines SCSL11, SCSL12, SCSL21, SCSL22. The column select lines CSL11, CSL12, CSL21, CSL22 are connected to primary memory cells for normal operation of the primary memory cells. The spare column select lines SCSL11, SCSL12, SCSL21, SCSL22, which are connected to spare memory cells, i.e., redundant memory cells, are for used to replace defective memory cells.

The input/output block 11 includes one local input/output line LIO1 and one global input/output line GIO1, and the input/output block 13 includes one local input/output line LIO2 and one global input/output line GIO2. The local input/output line LIO1 and the global input/output line GIO1 input and output data into memory cells in the input/output block 11, and the local input/output line LIO2 and the global input/output line GIO2 input and output data into memory cells in the input/output block 13.

In the one-to-one redundancy scheme shown in FIG. 1, if a column select line CSL11 in the input/output block 11 is defective, i.e., if at least one memory cell M1 connected to the column select line CSL11 is defective, the column select line CSL11 is replaced with a spare column select line SCSL11. If a column select line CSL21 in the input/output block 13 is defective, i.e., at least one memory cell connected to the column select line CSL21 is defective, the column select line CSL21 is replaced with a spare select line SCSL21. In other words, all memory cells connected to a defective column select line are replaced with spare memory cells connected to a spare column select line, even if only one memory cell connected to the column select line is defective.

In the one-to-one column redundancy scheme shown in FIG. 1, defective column select lines in a predetermined input/output block are replaced with only spare column select lines in the same input/output block. Because of this, the number of repairable column select lines in the input/output block depends on the number of spare column select lines available in the same input/output block.

FIG. 2 shows a conventional dataline column redundancy scheme. Referring to FIG. 2, in the dataline column redundancy scheme, input/output blocks 21 and 23 do not include spare column select lines. A redundant input/output block 25 includes spare column select lines.

The input/output block 21 includes one local input/output line LIO1, and the input/output block 23 includes one local input/output line LIO2. The redundant input/output block 25 also includes one local input/output line LIO3. The input/output blocks 21 and 23 and the redundant input/output block 25 share a global input/output line GIO.

Data is input into and output from memory cells in the input/output block 21 via the local input/output line LIO1 and the shared input/output line GIO, and data is input into and output from memory cells in the input/output block 23 via the local input/output line LIO2 and the shared input/output line GIO. Data is input into and output from memory cells in the redundant input/output block 25 via the local input/output line LIO3 and the shared global input/output line GIO.

In the dataline column redundancy scheme shown in FIG. 2, if column select lines CSL11 and CSL12 in the input/output block 21 are defective, the column select lines CSL11 and CSL12 are replaced with spare column select lines SCSL1 and SCSL2 in the redundant input/output block 25. If column select lines CSL21, CSL22, and CSL 23 in the input/output block 23 are defective, the column select lines CSL21, CSL22, CSL23 are replaced with spare column select lines SCSL3, SCSL4, and SCSL5 in the redundant input/output block 25.

Accordingly, in the dataline column redundancy scheme shown in FIG. 2, defective column select lines in the input/output blocks are replaced with spare column select lines in the redundant input/output block. Therefore, repair efficiency and flexibility may be improved to some extent. However, like the column redundancy scheme shown in FIG. 1, all memory cells connected to a column select line are replaced with the spare memory cells connected to a spare column select line even if only one memory cell connected to the defective column select line is defective.

SUMMARY OF THE INVENTION

According to some embodiments of the present invention, an integrated circuit memory device includes a plurality of memory cells arranged as a plurality of blocks, each of the blocks including a plurality of primary memory cells that are coupled and decoupled to and from respective input/output lines responsive to a primary column select line and a plurality of redundant memory cells that are coupled and decoupled to and from respective ones of the input/output lines responsive to a redundant column select line. A column select circuit is coupled to the primary column select lines and to the redundant column select lines. The column select circuit drives a first primary column select line associated with a primary memory cell in a first block responsive to application of a first column address. The column select circuit simultaneously drives the first primary column select line and a first redundant column select line associated with a first redundant memory cell in a second block responsive to application of a second column address. The memory device further includes a plurality of sense amplifiers, and an input/output control circuit that is configurable to selectively connect the input/output lines to the sense amplifiers such that the first primary memory cell is coupled to a sense amplifier responsive to application of the first column address and such that the first redundant memory cell is coupled to the sense amplifier responsive to application of the second column address. The select circuit and the input/output control circuit may be operative to replace an individual primary memory cell with an individual redundant memory cell. In some embodiments, the input/output control circuit includes a plurality of switches operative to couple and decouple the input/output lines to and from the sense amplifiers. A switch control circuit controls the plurality of switches. The control circuit may be fuse-programmable.

Related operating methods are also described.

DETAILED DESCRIPTION OF THE INVENTION

Figure 1:
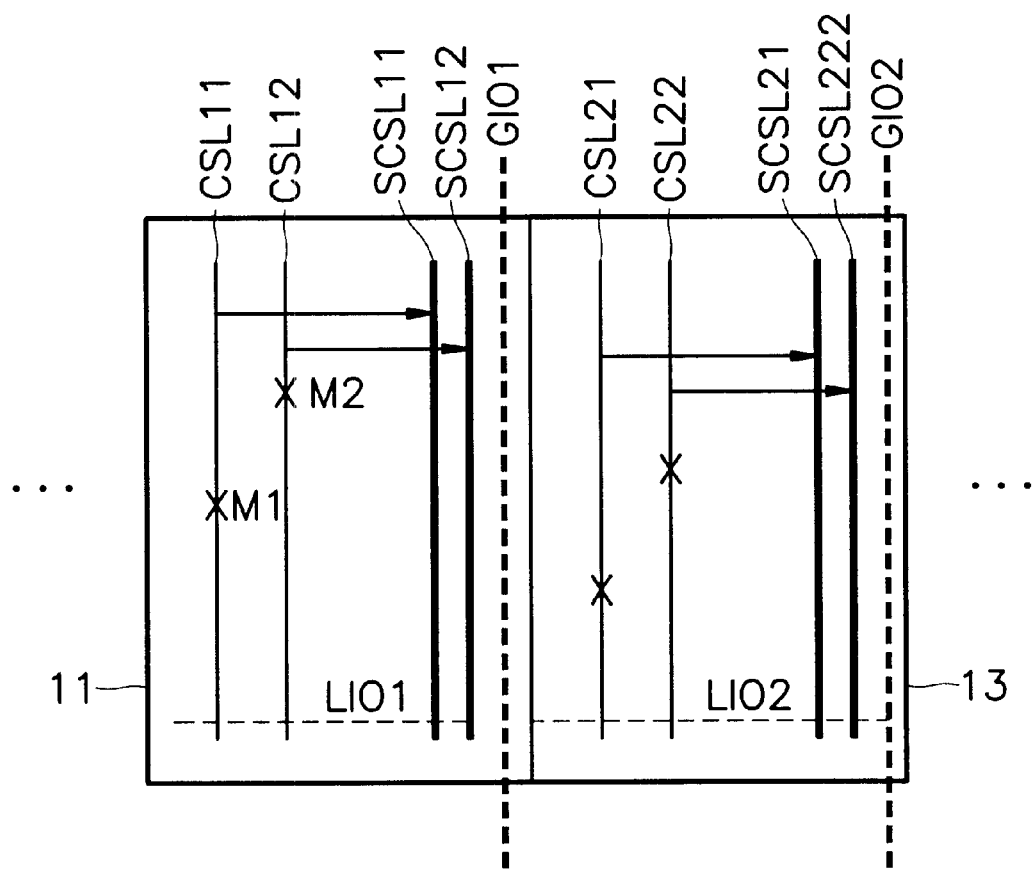
FIGS. 1 and 2 are schematic diagrams illustrating conventional integrated circuit memory devices.
Figure 2:
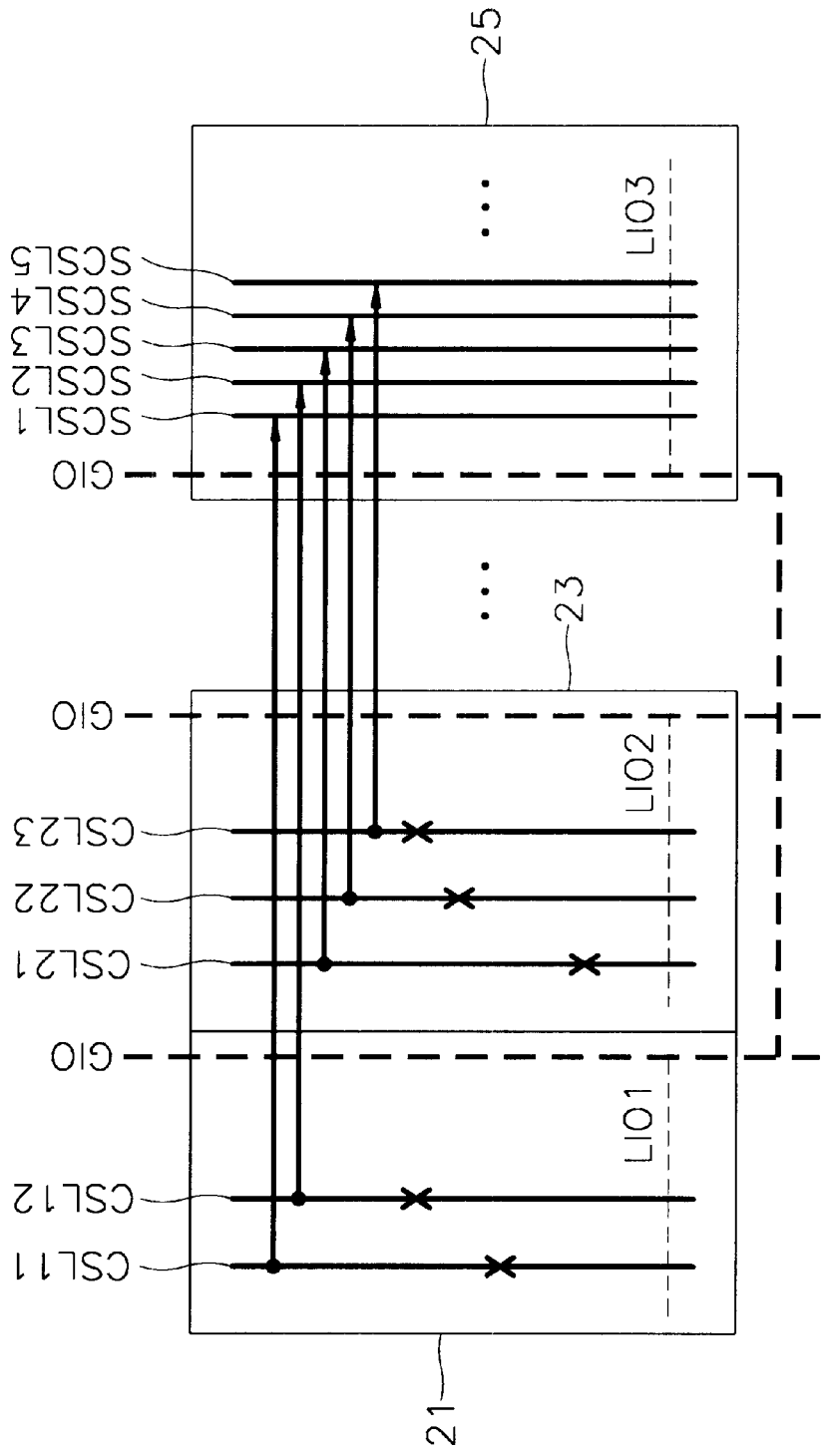

The present invention now will be described more fully hereinafter with reference to the accompanying drawings, in which typical embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 3:
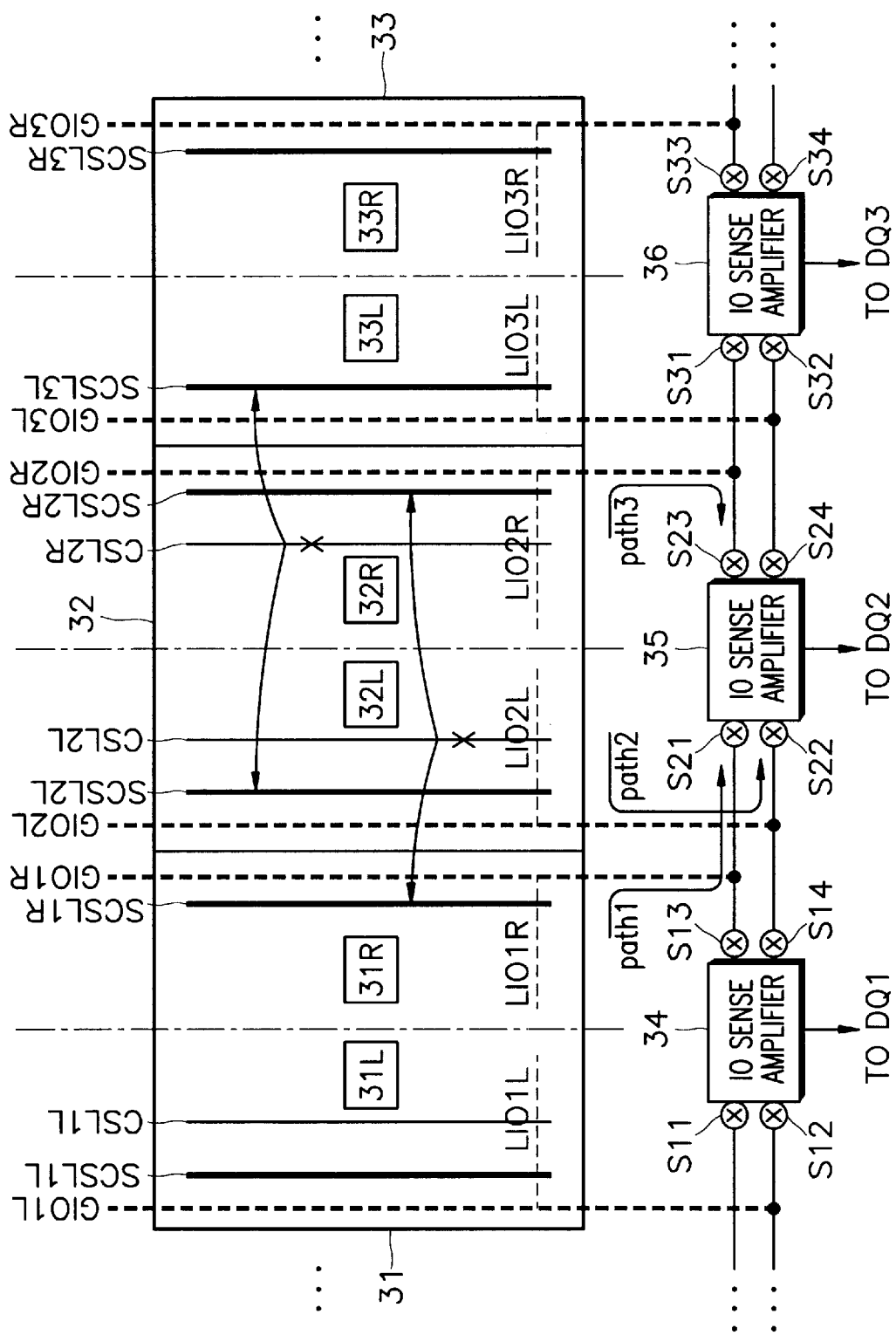
FIG. 3 is a schematic diagram illustrating a memory device according to some embodiments of the present invention.

Referring to FIG. 3, in an integrated circuit memory device according to the present invention, input/output blocks 31, 32, and 33 are divided into first blocks 31L, 32L, and 33L and second blocks 31R, 32R, and 33R, respectively. It will be understood that the input/output blocks 31, 32, and 33 may be divided into three or more blocks.

The first blocks 31L, 32L, and 33L and the second blocks 31R, 32R, and 33R each include a plurality of memory cells, column select lines CSL1L, CSL2L, CSL2R, SCSL2R connected to the plurality of memory cells, and spare column select lines SCSL1L, SCSL1R, SCSL2L, SCSL3L, SCSL3R. The column select lines CSL1L, CSL2L, CSL2R, SCSL2R are connected to primary memory cells for normal operation of the primary memory cells. The spare column select lines SCSL1L, SCSL1R, SCSL2L, SCSL3L, SCSL3R are connected to spare memory cells, i.e., redundant memory cells, to replace defective memory cells.

The input/output block 31 includes a local input/output line LIO1L and a global input/output line GIO1L for a first block 31L, and a local input/output line LIO1R and a global input/output line GIO1R for a second block 31R. The input/output block 32 includes a local input/output line LIO2L and a global input/output line GIO2L for a first block 32L, and a local input/output line LIO2R and a global input/output line GIO2R for a second block 32R. The input/output block 33 includes a local input/output line LIO3L and a global input/output line GIO3L for a first block 33L, and a local input/output line LIO3R and a global input/output line GIO3R for a second block 33R.

In the input/output block 31, data is input into and output from memory cells in the first block 31L via the local input/output line LIO1L and the global input/output line GIO1L, and data is input into memory cells in the second block 31R via the local input/output line LIO1R and the global input/output line GIO1R. In the input/output block 32, data is input into and output from memory cells in the first block 32L via the local input/output line LIO2L and the global input/output line GIO2L, and data is input into memory cells in the second block 32R via the local input/output line LIO2R and the global input/output line GIO2R. In the input/output block 33, data is input into and output from memory cells in the first block 33L via the local input/output line LIO3L and the global input/output line GIO3L, and data is input into memory cells in the second block 33R via the local input/output line LIO3R and the global input/output line GIO3R.

If a cell associated with the column select line CSL2L in the first block 32L of the input/output block 32 is defective, the column select line CSL2L is not replaced with a spare column select line SCSL2L in its input/output block, i.e., the first block 32L of the input/output block 32. Instead, the column select line may be replaced with the spare column select line SCSL2R in the second block 32R of the input/output block 32 or the spare column select line SCSL1R in the second block 31R of the input/output block 31 adjacent to the input/output block 32.

This allows a defective memory cell of memory cells connected to the defective column select line CSL2L to be replaced with a spare memory cell connected to the spare column select line, while primary memory cells of memory cells connected to the defective column select line CSL2L are not replaced. In particular, the primary column select line (associated with the defective cell) and the spare column select line are simultaneously activated, such that the memory cells connected to the primary column select line are used, except when the defective cell is to be accessed.

If a memory cell associated with a column select line CSL2R in the second block 32R of the input/output 32 is defective, the column select line CSL2R is not replaced with a spare column select line SCSL2R in its input/output block, i.e., the second block 32R of the input/output block 32. Instead, the column select line CSL2R is replaced with the column select line SCSL2L in the first block 32L of the input/output block 32 or a spare column select line SCSL3L in the first block 33L of the input/output block 33 adjacent to the input/output block 32. Only a defective memory cell of memory cells connected to the defective column select line CSL2R is replaced with a spare memory cell connected to the spare column select line, while non-defective memory cells of memory cells connected to the defective column select line CSL2R are not replaced. The defective column select line CSL2R and the spare column select line are simultaneously activated, such that the memory cells connected to the primary column select line are used, except when the defective cell is to be accessed. If the input/output blocks 31 and 33 have defective cells, defective memory cells may be replaced with spare memory cells as described above.

A integrated circuit memory device according to embodiments of the present invention illustrated in FIG. 3 includes switches S11, S12, S13, S14, S21, S22, S23, S24, S31, S32, S33, S34, a switch controller (shown in FIG. 6) for controlling switches S11 through S34, and input/output sense amplifiers 34, 35, and 36. The input/output sense amplifiers 34, 35, and 36 are each connected to corresponding input/output pins DQ1, DQ2, and DQ3.

The switches S11, S12, S13, S14, S21, S22, S23, S24, S31, S32, S33, S34 control the connection between global input/output lines GIO and the input/output sense amplifiers 34, 35, and 36. In particular, as described above, since the primary column select line having a defective cell and the spare column select line are simultaneously activated, the switches S11, S12, S13, S14, S21, S22, S23, S24, S31, S32, S33, S34 can simultaneously form a data path through the defective column select line and a data path through the spare column select line toward a input/output sense amplifier.

For example, a path path 2 from the global input/output line GIO2L corresponding to a column select line CSL2L, and a path path 1 from the global input/output line GIO1R corresponding to the spare column select line SCSL1R can be simultaneously formed to the input/output sense amplifier 35 when the column select line CSL2L is treated as defective and replaced with the spare column select line SCSL1R. A path path2 from the global input/output line GIO2L corresponding to the column select line CSL2L and a path path3 from the global input/output line GIO2R corresponding to the spare column select line SCSL2R can be simultaneously formed to the input/output sense amplifier 35 if the column select line CSL2L is treated as defective and replaced with the spare column select line SCSL2R.

Figure 4:
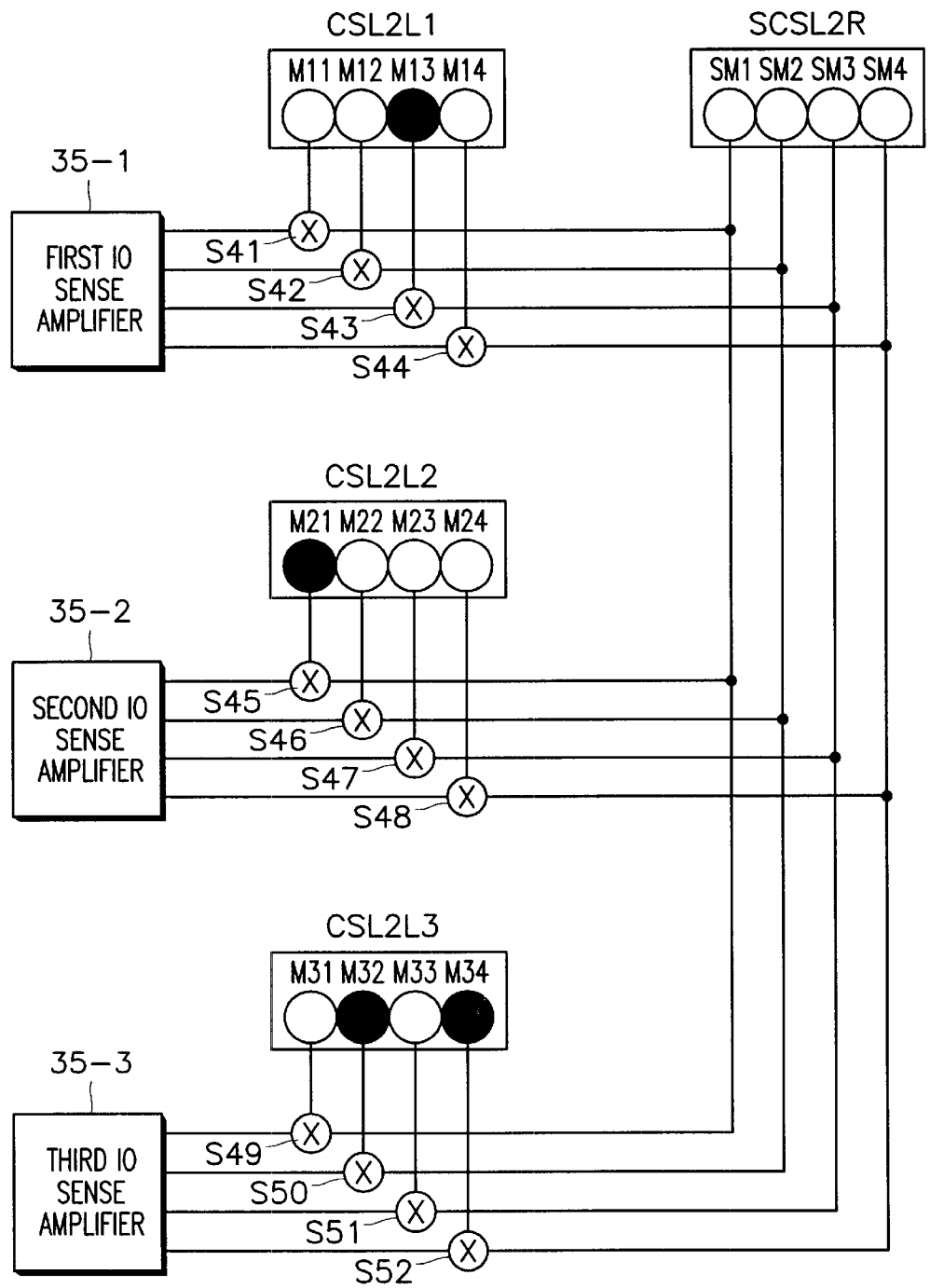
FIG. 4 is a schematic diagram illustrating a memory device according to further embodiments of the present invention.

FIG. 4 is a diagram explaining how defective memory cells may be replaced with spare memory cells in an integrated circuit memory device according to embodiments of the present invention shown in FIG. 3. CSL2L1, CSL2L2, and CSL2L3 denote column select lines in the first block 32L of the input/output block 32 shown in FIG. 3, and SCSL2R denotes a spare column select line in the second block 32R of the input/output block 32. The column select lines CSL2L1, CSL2L2, and CSL2L3 and the spare column select line SCSL2R are each connected to four memory cells.

If the third memory cell M13 of four memory cells M11–M14 connected to the column select line CSL2L1 is defective, three primary memory cells M11, M12, and M14 are connected to a first sense amplifier 35-1 by switches S41, S42, and S44, and a third spare memory cell SM3, which is connected to the column select line SCSL2R, instead of the defective memory cell M13, is connected to the first sense amplifier 35-1 by a switch S43. If the first memory cell M21 of four memory cells M21-M24 connected to the column select line CSL2L2 is defective, three primary memory cells M22, M23, and M24 are connected to a second sense amplifier 35-2 by switches S46, S47, and S48, and a first spare memory cell SM1, which is connected to the spare column select line SCSL2R, instead of the defective memory cell M21, is connected to the second sense amplifier 35-2 by a switch S45. If the second and fourth memory cell M32 and M34 of four memory cells M31–M34 connected to the column select line CSL2L3 are defective, two primary memory cells M31 and M33 are connected to a third sense amplifier 35-3 by switches S49 and S51, respectively, and spare memory cells SM2 and SM4, which are connected to the spare column select line SCSL2R, instead of the defective memory cells M32 and M34, are connected to the third sense amplifier 35-3 by switches S50 and S52, respectively. Therefore, defective memory cells connected to one or more column select lines may be replaced with spare memory cells connected to one spare column select line an a per bit basis.

Figure 5:
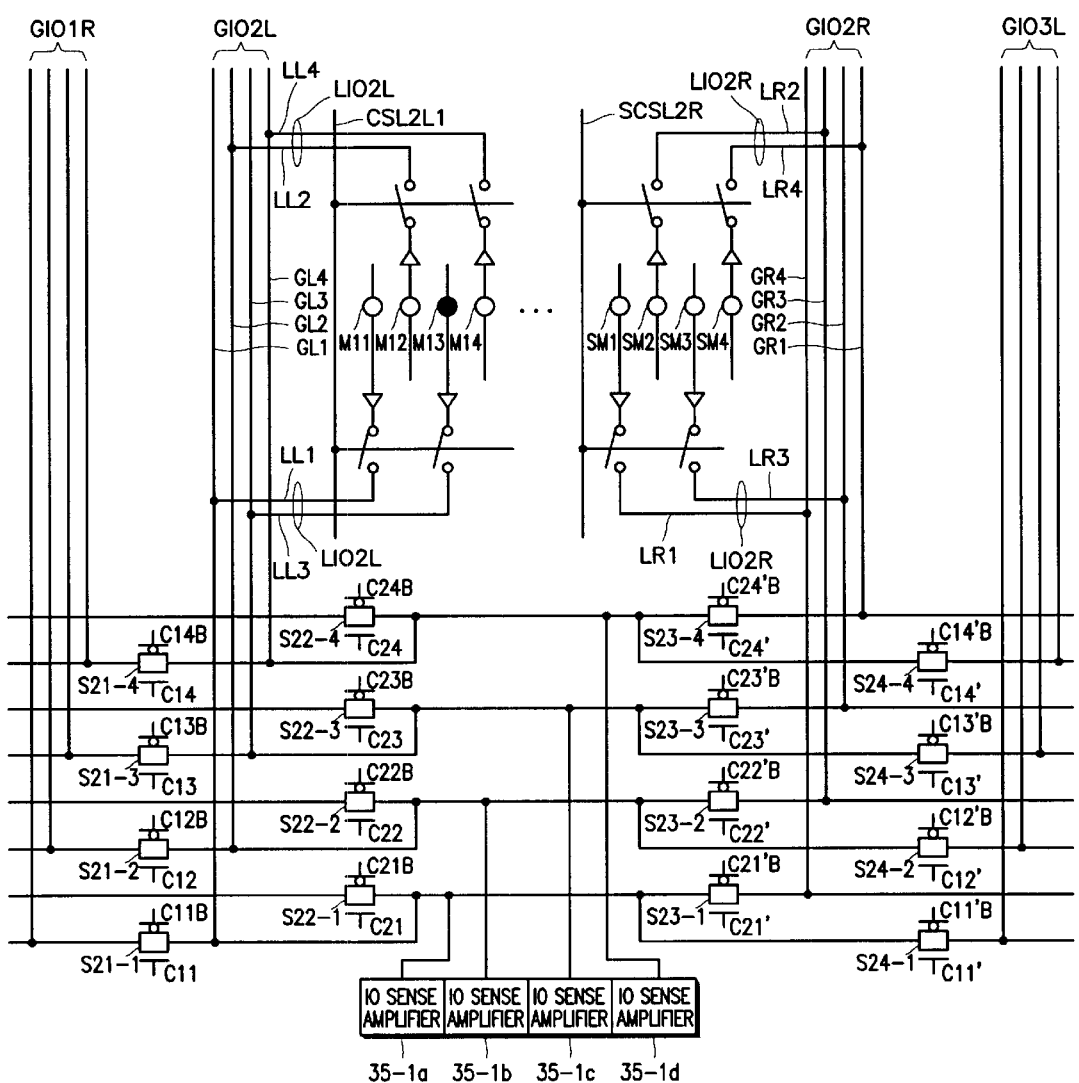
FIG. 5 is a schematic diagram illustrating a memory device according to still further embodiments of the present invention.

FIG. 5 is a detailed circuit diagram of a portion of the circuit shown in FIGS. 3 and 4. The column select line CSL2L1 and the spare column select line SCSL2R are simultaneously activated by a column driver (not shown). Switches S22-1, S22-2, and S23-3 are turned on, and switches S22-3, S23-1, S23-2, and S23-4 are turned off. As a result, global input/output lines GL1, GL2, and GL4 corresponding to the primary memory cells M11, M12, and M14 and a global input/output line GR3 corresponding to the spare memory cell SM3 are connected to input/output sense amplifiers 35-1a, 35-1b, 35-1c, and 35-1d.

Accordingly, data of the primary memory cells M11, M12, M14 is transmitted to the input/output sense amplifiers 35-1a, 35-1b, 35-1c, and 35-1d via local input/output lines LL1, LL2, and LL4 and global input/output lines GL1, GL2, and GL4. However, data of the defective memory cell M13 is not transmitted to the input/output sense amplifier 35-1c. Instead, data of the spare memory cell SM3 is transmitted to the input/output sense amplifier 35-1c via a local input/output line LR3 and a global input/output line GR3. The defective memory cell M13 is replaced with the spare memory cell SM3.

Figure 6:
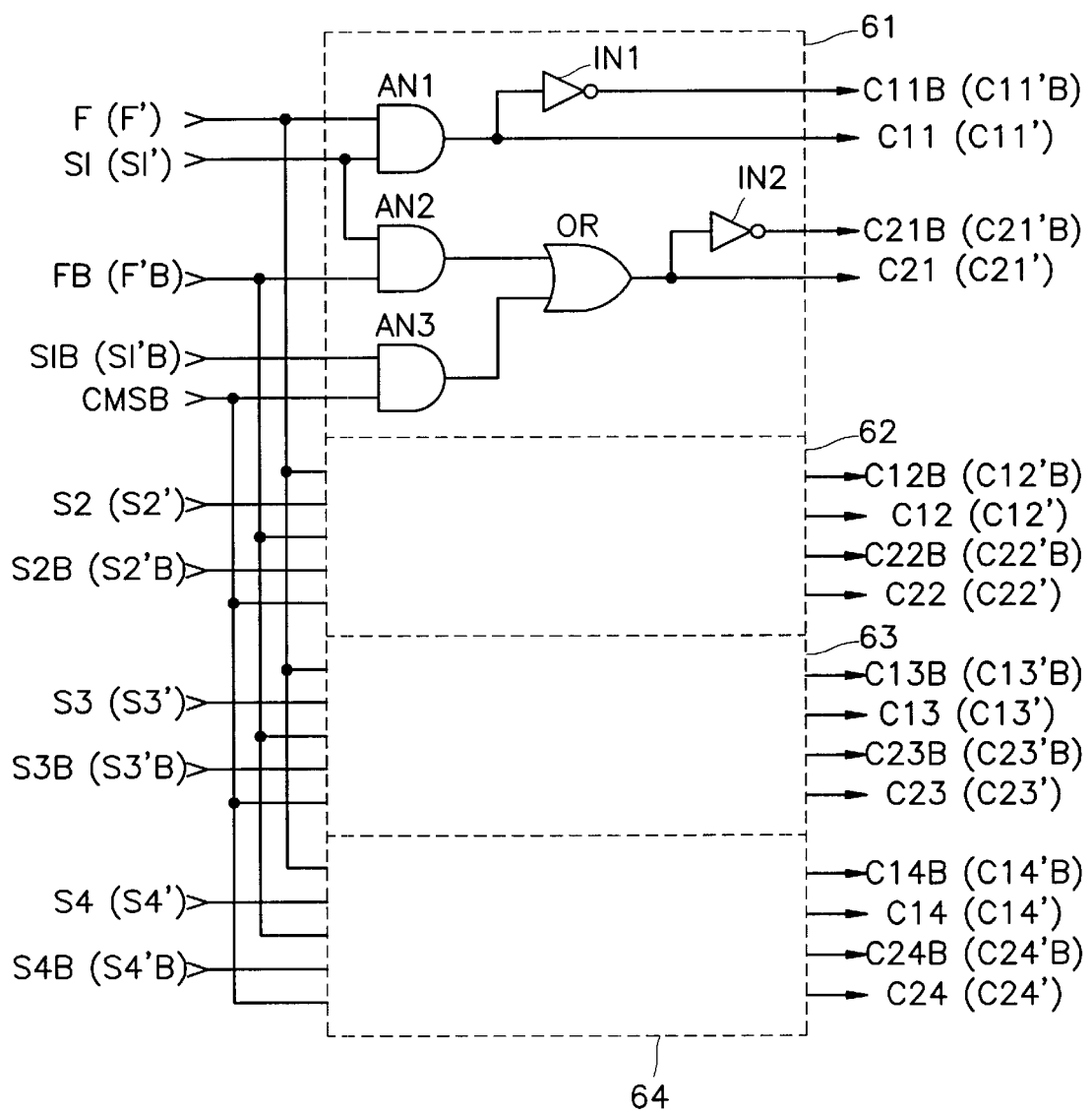
FIG. 6 is a schematic diagram illustrating a switch control circuit according to further embodiments of the present invention.

FIG. 6 is a detailed circuit diagram of a switching controller that may be used with the circuit of FIG. 5. Referring to FIG. 6, the switching controller includes a plurality of control signal generating circuits 61, 62, 63, 64. The control signal generating circuits 61, 62, 63, 64 each include AND gates AN1, AN2, and AN3, an OR gate, and inverters IN1 and IN2. F (or F') is a signal representing the position of an input/output block having defective column select lines. F (or F') is logic "low" if a predetermined input/output block has defective column select lines and logic "high" if an input/output block adjacent to the predetermined input/output block has defective column select lines. S1 (or S1') is a signal which is logic "high" if the first memory cell connected to a defective column select line is defective and an applied column address corresponds to the first memory cell, and is logic "low" otherwise. S2 (or S2') is a signal which is logic "high" if the second memory cell connected to the column select line is defective and an applied column address corresponds to the second memory cell, and is logic "low" otherwise. S3 (or S3') is a signal which is logic "high" if the third memory cell connected to the column select line is defective and an applied column address corresponds to the third memory cell, and is logic "low" otherwise. S4 (or S4') is a signal which is logic "high" if the fourth memory cell connected to the column select line is defective and an applied column address corresponds to the fourth memory cell, and is logic "low" otherwise.

Signals F, F', S1, S2, S3, S4, S1' S2', S3', S4' may be generated, for example, by programming fuses in a fuse block (not shown). Such fuse blocks are well known to one skilled in the art; therefore, discussion of detailed operation of the fuse block is omitted.

Column most significant bit (CMSB) is the most significant bit of the column address and represents the positions of first and second blocks in an input/output block. In particular, CMSB is logic "high" if representing the position of the first block in the input/output block and logic "low" if representing the position of the second block in the input/output block.

The operation of the switching controller and the overall operation of the circuit shown in FIG. 5 will be described with reference to FIGS. 5 and 6. F is set to logic "low," S3 is logic "low", and S1, S2, and S4 are all logic "high" if the third memory cell M13 connected to the column select line CSL2L1 is defective and the column address applied from the outside is for the third memory cell M13. Also, CMSB is logic "high".

As a result, switch control signals C11, C12, C13, C14 are logic "low" and inverse switch control signals C11B, C12B, C13B, C14B are logic "high". Switch control signals C21, C22, C24 are logic "high" and inverse switch control signals C21B, C22B, C23B are logic "low". Also, switch control signal C23 is logic "low" and an inverse switch signal C23B is logic "high." Thus, switches S21-1, S21-2, S21-3, and S21-4 are turned off, switches S22-1, S22-2, and S22-4 are turned on, and switch S22-3 is turned off. As a result, global input/output lines GL1, GL2, and GL4 corresponding to primary memory cells M11, M12, M14 are connected to input/output sense amplifiers 35-1a, 35-1b, 35-1d.

Switch control signals C11', C12', C13', C14' are all logic "low" and inverse switch control signals C11'B, C12'B, C13'B, C14'B are all logic "high". Switch control signals C21 ', C22', C24' are logic "low" and inverse switch control signals C21'B, C22'B, C24'B are logic "high." Switch control signal C23' is logic "high" and inverse switch control signal C23'B is logic "low". Thus, switches S24-1, S24-2, S24-3, S24-4 are turned off, switches S23-1, S23-2, S23-4 are turned off and switch S23-3 is turned on. As a result, the global input/output line GR3 corresponding to the spare memory cell SM3 is connected to the input/output sense amplifier 35-1c.

Accordingly, as described above, data of the primary memory cells M11, M12, and M14 is transmitted to the input/output sense amplifier 35-1a, 35-1b, and 35-1d via the local input/output lines LL1, LL2, and LL4 and the global input/output lines GL1, GL2, and GL4. However, data of the defective memory cell M13 is not transmitted to the input/output sense amplifier 35-1c. Instead, data of the spare memory cell SM13 is transmitted to the input/output sense amplifier 35-1c via the local input/output line LR3 and the global input/output line GR3. The defective memory cell M13 is thus replaced with the spare memory cell SM3.

As described above, in the integrated circuit memory device according to embodiments of the present invention, defective memory cells connected to one column select line may be replaced with spare memory cells connected to one spare column select line on a per bit basis. Also, defective memory cells connected to one or more column select lines may be replaced with spare memory cells connected to one spare column select line. Thus, repair efficiency and flexibility can be greatly improved.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. An integrated circuit memory device, comprising:
    a plurality of memory cells arranged as a plurality of blocks, each of the blocks including a plurality of primary memory cells that are coupled and decoupled to and from respective input/output lines responsive to a primary column select line and a plurality of redundant memory cells that are coupled and decoupled to and from respective ones of the input/output lines responsive to a redundant column select line;
    a column select circuit, coupled to the primary column select lines and to the redundant column select lines, that drives a first primary column select line associated with a primary memory cell in a first block responsive to application of a first column address and that simultaneously drives the first primary column select line and a first redundant column select line associated with a first redundant memory cell in a second block responsive to application of a second column address;
    a plurality of sense amplifiers; and
    an input/output control circuit configurable to selectively connect the input/output lines to the sense amplifiers such that the first primary memory cell is coupled to a sense amplifier responsive to application of the first column address and such that the first redundant memory cell is coupled to the sense amplifier responsive to application of the second column address.

2. The integrated circuit memory device of claim 1, wherein the select circuit and the input/output control circuit are operative to replace an individual primary memory cell with an individual redundant memory cell.

3. The integrated memory device of claim 1, wherein the input/output control circuit comprises:
    a plurality of switches operative to couple and decouple the input/output lines to and from the sense amplifiers; and
    a switch control circuit that controls the plurality of switches.

4. The integrated memory device of claim 3, wherein the switch control circuit is fuse programmable.

5. A integrated circuit memory device comprising:
    a plurality of input/output blocks which are each divided into first and second blocks having a plurality of memory cells;
    column select lines for normal operation of primary memory cells; and
    spare column select lines for replacing defective memory cells,
    wherein only defective memory cells of a plurality of memory cells connected to at least one defective column select line in a predetermined input/output block are replaced with spare memory cells connected to a predetermined spare column select line per bit unit.

6. The integrated circuit memory device of claim 5, wherein the defective column select line and the predetermined spare column select line are simultaneously activated.

7. The integrated circuit memory device of claim 5, wherein the defective column select line is not replaced with a spare column select line in the first block of the predetermined input/output block but instead is replaced with any one of a spare column select line in a second block of the predetermined input/output block and a spare column select line in a second block of an input/output block adjacent to the predetermined input/output block if the defective column select line is positioned in a first block of the predetermined input/output block.

8. The integrated circuit memory device of claim 7, wherein the defective column select line is not replaced with a spare column select line in the second block of the input/output block but instead is replaced with any one of a spare column select line in the first block of the input/output block and a spare column select line in a first block of another input/output block adjacent to the predetermined input/output block if the defective column select line is positioned in the second block of the predetermined input/output block.

9. The integrated circuit memory device of claim 5, further comprising:
- a plurality of input/output sense amplifiers for each of the input/output blocks; and
- a switching controller for connecting global input/output lines corresponding to primary memory cells, but not the defective memory cells, of the plurality of memory cells and global input/output lines corresponding to the replaced spare memory cells to an input/output sense amplifier for the predetermined input/output block.

10. A integrated circuit memory device comprising:
- a plurality of input/output blocks which are divided into first and second blocks, both having a plurality of memory cells;
- column select lines for normal operation of primary memory cells; and
- spare column select line for replacing defective memory cells,
- wherein a defective column select line in a first block of a predetermined input/output block is not replaced with a spare column select line in the first block of the predetermined input/output block but instead is replaced with any one of a spare column select line in a second block of the predetermined input/output block and a spare column select line in a second block of an input/output block adjacent to the predetermined input/output block.

11. The integrated circuit memory device of claim 10, wherein a defective column select line in the second block of the predetermined input/output block is not replaced with a spare column select line in the second block of the input/output block but instead is replaced with any one of a spare column select line in the first block of the input/output block and a spare column select line in a first block of another input/output block adjacent to the predetermined input/output block.

12. The integrated circuit memory device of claim 10, wherein the defective column select line and the replaced spare column select line are simultaneously activated.

13. The integrated circuit memory device of claim 12, wherein only defective memory cells of a plurality of memory cells connected to the defective column select line are replaced with spare memory cells connected to the replaced spare column select line per bit unit.

14. The integrated circuit memory device of claim 13, further comprising:
- a plurality of input/output sense amplifier for each of the input/output blocks; and
- a switching controller for connecting global input/output lines corresponding to primary memory cells, but not the defective memory cells, of the plurality of memory cells and global input/output lines corresponding to the replaced spare memory cells to an input/output sense amplifier for the predetermined input/output block.

15. A integrated circuit memory device comprising:
- a plurality of input/output blocks which are divided into more than two blocks, each having a plurality of memory cells, column select lines for normal operation of primary memory cell, and spare column select lines for replacing defective memory cells,
- wherein only defective memory cells of a plurality of memory cells connected to at least one defective column select line of a predetermined input/output block are replaced with spare memory cells connected to a predetermined spare column select line per bit unit.

16. The integrated circuit memory device of claim 15, wherein the defective column select line and the predetermined spare column select line are simultaneously activated.

17. The integrated circuit memory device of claim 15, further comprising:
- a plurality of input/output sense amplifiers for each of the input/output blocks; and
- a switching controller for connecting global input/output lines corresponding to primary memory cells, but not the defective memory cells, of the plurality of memory cells and global input/output lines correspond to the replaced spare memory cells to an input/output sense amplifier for the predetermined input/output block.

18. A method operating a memory device comprising a plurality of memory cells arranged as a plurality of blocks, each of the blocks including a plurality of primary memory cells that are coupled and decoupled to and from respective input/output lines responsive to a primary column select line and a plurality of redundant memory cells that are coupled and decoupled to and from respective ones of the input/output lines responsive to a redundant column select line, the method comprising:
- driving a first primary column select line associated with a primary memory cell in a first block responsive to application of a first column address;
- simultaneously driving the first primary column select line and a first redundant column select line associated with a first redundant memory cell in a second block responsive to application of a second column address; and
- selectively connecting input/output lines associated with the first primary memory cell and the first redundant memory cell to a sense amplifier such that the first primary memory cell associated with the first primary column select line is coupled to the sense amplifier responsive to application of the first column address and such that the first redundant memory cell associated with the first redundant column select line is coupled to the sense amplifier responsive to application of the second column address.

19. The method of claim 18, comprising replacing an individual primary memory cell with an individual redundant memory cell.

20. The method of claim 18, wherein selectively connecting input/output lines associated with the first primary memory cell and the first redundant memory cell to a sense amplifier comprises operating a plurality of switches that are operative to couple and decouple input/output lines to and from the sense amplifier.

21. The method of claim 20, wherein selectively connecting input/output lines associated with the first primary memory cell and the first redundant memory cell to a sense amplifier is preceded by programming a switch control circuit to control the plurality of switches such that the first primary memory cell associated with the first primary column select line is coupled to the sense amplifier responsive to application of the first column address and such that the first redundant memory cell associated with the first redundant column select line is coupled to the sense amplifier responsive to application of the second column address.

* * * * *